United States Patent [19]

Tiemeijer

[11] Patent Number: 5,337,176
[45] Date of Patent: Aug. 9, 1994

[54] OPTICAL AMPLIFIER WITH IMPROVED LINEARITY

[75] Inventor: Lukas F. Tiemeijer, Eindhoven, Netherlands

[73] Assignee: U. S. Philips Corporation, New York, N.Y.

[21] Appl. No.: 29,253

[22] Filed: Mar. 10, 1993

[30] Foreign Application Priority Data

Mar. 25, 1992 [EP] European Pat. Off. ......... 92200850.3

[51] Int. Cl.$^5$ ............................................... H01S 3/19
[52] U.S. Cl. ..................................... 359/344; 359/337; 372/46
[58] Field of Search .................. 359/344, 337; 372/33, 372/46, 81

[56] References Cited

U.S. PATENT DOCUMENTS

| | | | |
|---|---|---|---|
| 4,376,307 | 3/1983 | Rozzi et al. | 372/45 |
| 4,907,055 | 3/1990 | Shinada | 357/30 |
| 4,952,017 | 8/1990 | Henry et al. | 359/344 |

FOREIGN PATENT DOCUMENTS

0466144 1/1992 European Pat. Off. .

OTHER PUBLICATIONS

"Physics of Semiconductor Devices" by S. M. Sze, Chapter 12, John Wiley & Sons, Inc. 1981.

"Semiconductor Laser Optical Amplifiers for Use in Future Fiber Systems" by M. J. O'Mahony in Journal of Lightwave Technology, vol. 6, No. 11, Apr. 1988.

"Compensation of Nonlinearity in Semiconductor Optical Amplifiers", Electronics Letters Jul. 21, 1988, vol. 24, No. 15, pp. 950–952.

Primary Examiner—Mark Hellner
Attorney, Agent, or Firm—Richard A. Weiss

[57] ABSTRACT

Optical amplifier which utilizes a solid-state laser as an amplifying element. In the optical amplifier, according to the invention, a linearity improvement is achieved by feeding the solid-state laser from a voltage source rather than from a current source, as is customary.

14 Claims, 2 Drawing Sheets

OPTICAL AMPLIFIER WITH IMPROVED LINEARITY

BACKGROUND OF THE INVENTIONS

The invention relates to an optical amplifier comprising a solid-state laser for amplifying an optical input signal to produce an optical output signal, and a power supply source connected to the solid-state laser for supplying electrical pump energy to the solid-state laser.

The invention also relates to a transmission system utilizing such amplifiers.

An optical amplifier as defined in the opening paragraph is known from the journal article "Compensation of non-linearity in semiconductor optical amplifiers" by A. Saleh, R. Jopson and T. Darcie in Electronics Letters, July 1988, Vol. 24, No. 15, pp. 950–952.

Optical amplifiers are used, for example, in optical transmission systems which utilize glass fibers as a transmission medium. Optical transmission systems are often used for digital trunk lines between telephone exchanges. Another application is the use in cable television networks for the distribution of analog TV signals over large distances.

The maximum length of a glass fiber which may be covered at one time by an optical signal is restricted by various causes. A first cause for this restriction is an attenuation of the optical signal in the glass fiber transmitted by a transmitter. A second cause is a dispersion of the glass fiber which causes distortion of pulses transmitted by a transmitter in the case of digital transmission. This pulse distortion occurs as a result of the glass fiber producing a delay, which is different for optical signals having different wavelengths. This pulse distortion is proportional to the length of the glass fiber and, in addition, depends on the spectral width of the transmitted optical signal.

To cover large distances by means of glass fibers, what are commonly referred to as regenerative repeaters are used, and they are installed equidistantly in the glass fiber. A regenerative repeater comprises a complete optical receiver which converts received optical signal(s) into digital electric signal(s). In addition, a regenerative repeater comprises a complete optical transmitter which reconverts the digital signal(s) into light signal(s) for further transmission through a glass fiber. Such a regenerative repeater is rather complex.

In transmission systems utilizing lasers that generate an optical signal with a very small spectral bandwidth, the maximum distance that can be covered will primarily be determined by the attenuation of the glass fiber. In these case there is no need to use a regenerative repeater, for an optical amplifier will be sufficient to amplify the optical signal.

Because an optical amplifier, often comprising a solid-state laser as its amplifying element, is much simpler than a regenerative repeater, a considerable saving of costs can realized in using it instead of a regenerative repeater. A further advantage of the use of an optical amplifier is that its operation is independent of the symbol rate, and the amplifier is capable of simultaneously amplifying optical signals having different wavelengths.

An important property of an optical amplifier is its linearity of the relation between the optical input signal of the amplifier and the optical output signal. In trunk lines in which various amplitude-modulated optical carriers are utilized, what is commonly referred to as saturation-induced crosstalk occurs. This crosstalk occurs because the actual optical output power per carrier depends on the actual output power of the other carriers due to the non-linearity.

Another use of optical amplifiers which demands a proper linearity is the use of optical distribution in cable TV systems. In these systems the signal to be distributed, which may comprise, for example, the entire UHF band (470–860 MHz), is converted into an amplitude-modulated optical signal which is distributed through a glass fiber. If non-linear elements such as, for example, a non-linear optical amplifier, are present in this distribution system, noise components resulting from intermodulation may be generated and occur in a desired (TV) channel.

In the optical amplifier known from above journal article, a solid-state laser is used as an amplifier element. The electrical pump energy necessary for the solid-state laser is supplied by a power supply source in this case a current source. To improve the linearity of the solid-state laser, the current supplied to the solid-state laser contains not only a DC component but also an additional component which is proportional to the power of the light signal at the input of the solid-state laser.

To generate the additional component of the current supplied to the solid-state laser, an optical coupler is necessary for extracting part of the optical signals at the input of the solid-state laser. This extracted part of the optical signal is subsequently to be converted, by means of a photodiode into an electric signal, which, in turn, is reconverted into the additional component of the current for the solid-state laser. The presence of a In trunk lines in which various amplitude-modulated optical carders are generating unit for generating the additional component of the current for the solid-state laser, makes the optical amplifier rather complicated.

SUMMARY OF THE INVENTIONS

It is an object of the invention to provide an optical amplifier as defined in the opening paragraph, having reduced complexity, but retaining the linearity of the prior-art optical amplifier. For this purpose, the invention is characterized in that the power supply source is a voltage source.

In trunk lines in which various amplitude-modulated optical carders are

The invention is based on the recognition that a gain factor of a solid-state laser is mainly determined by the voltage across the active layer of the solid-state laser. For that matter, the voltage across the active layer determines quasi-Fermi levels in a conduction band and a valence band and thus the density of a load carriers in the two bands. Since the gain of a solid-state laser is determined by this density of and a number of constant values, the gain will be constant in the case of a constant density of load carriers in the two bands.

By supplying power to the solid-state laser from a voltage source instead of a current source, as in the prior-art optical amplifier, it is possible to maintain the voltage across the active layer of the solid-state laser and thus the gain at a constant level, irrespective of the value of the optical input signal. In the case of a strong optical input signal the solid-state laser will automatically consume more current from the voltage source to produce the necessary optical output power.

An embodiment of the invention is characterized, in that the voltage source has a negative output impedance. The use of a voltage source having a negative output impedance makes it possible to maintain the voltage across the active layer of the solid-state laser at a substantially constant level despite the presence of an undesired series resistance in series with the solid-state laser. A possible choice for the absolute value of this negative output impedance is the overall value of the series resistance of the solid-state laser. However, for obtaining the optimum linearity of the optical amplifier, it is conceivable for the absolute value of the output impedance of the voltage source to be chosen to be greater or smaller than the series resistance of the solid-state laser.

A further embodiment of the invention is characterized, in that the amplifier comprises a temperature measuring unit for measuring the temperature of the solid-state laser. That unit includes an adjusting unit for adjusting the voltage generated by the voltage source in response to the measured temperature of the solid-state laser. By measuring the temperature of the solid-state laser and giving the voltage generated by the voltage source the proper dependence on the measured temperature, it is possible to render the gain of the optical amplifier independent of the temperature of the solid-state laser.

BRIEF DESCRIPTION OF THE DRAWING

The invention will now be further explained with reference to the figures in which like reference characters denote like elements in which.

DESCRIPTION OF THE PREFERRED EMBODIMENTS

Figure 1:
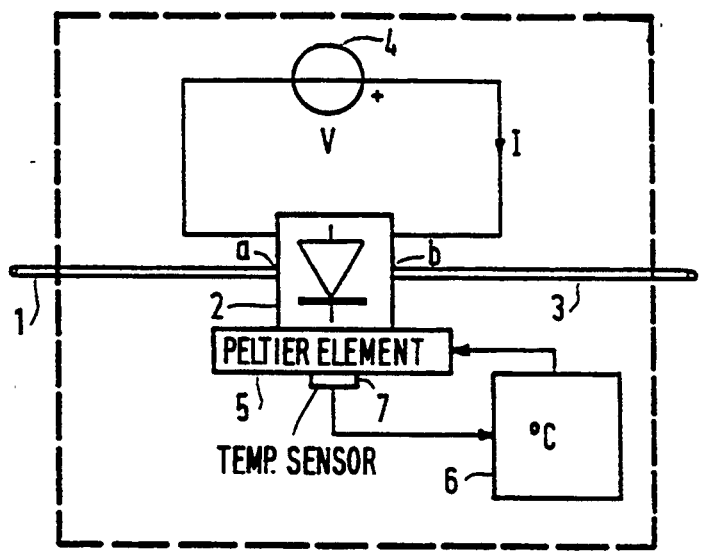
Fig. 1 shows a first embodiment of an optical amplifier according to the invention.

In the optical amplifier as shown in FIG. 1, a glass fiber 1 is coupled to a first facet a of a solid-state laser, in this case a semiconductor laser 2. A second facet b of the semiconductor laser is coupled to a second glass fiber 3. The anode of the semiconductor laser 2 is connected to a positive terminal of the voltage source 4 and the cathode of the semiconductor laser 2 is connected to a negative terminal of the voltage source 4.

The semiconductor laser 2 is arranged on a Peltier element 5. Furthermore, the Peltier element 5 accommodates a temperature sensor 7 for measuring the temperature of the Peltier element 5. An output signal of the temperature sensor 7 is applied to a control circuit 6. An output of the control circuit 6 is connected to the Peltier element 5.

The semiconductor laser 2 in the optical amplifier as shown in FIG. 1 uses the facets a and b to capture in the semiconductor laser 2 an optical signal to be amplified and to extract from the semiconductor laser 2 an amplified optical signal. The semiconductor laser is capable of amplifying both an optical signal captured on facet a and an optical signal captured on facet b. In many cases the semiconductor laser 2 is symmetrical, which means that the two facets present the same reflectivity.

The operation and structure of semiconductor lasers, as well as the materials suitable for manufacturing semiconductor lasers, are described in the book entitled "Physics of Semiconductor Devices" by S. M. Sze, chapter 12, John Wiley & Sons, Inc. 1981. The use of semiconductor lasers for amplifying optical signals is known from the journal article "Semiconductor Laser Optical Amplifiers for Use in Future Fiber Systems" by M. J. O'Mahony in Journal of Lightwave Technology, Vol. 6, No. Apr. 11, 1988.

By utilizing, in accordance with the inventive idea, a voltage source 4 as the power supply source for supplying electrical pump energy to the semiconductor laser 2, the gain of the semiconductor laser 2 becomes less dependent on the power of the optical signal to be amplified than in the case of a semiconductor laser which is supplied, as is customary, with a DC current. As a result, a complex compensation unit for enlarging the current flowing through the semiconductor laser as discussed in the above journal article by Saleh, Jopson and Darcie is no longer necessary.

The voltage V is to be selected such that the current I, in the absence of a optical signal to be amplified, continues to be below the threshold current of the semiconductor laser 2. This avoids undesired oscillation of the semiconductor laser 2.

To avoid the gain of the semiconductor laser 2 changing as a result of temperature variations, the temperature of the semiconductor laser 2 is maintained at a constant level. This is done with the aid of a Peltier element 5, which accommodates the temperature sensor 7 for measuring the temperature of the Peltier element 5. If the temperature of the Peltier element 5, and thus the semiconductor laser 2, deviates from the desired value, the control circuit 6 will send an electric current through the Peltier element 5 to cool this down if the measured temperature is too high, or to heat it up if the measured temperature is too low. A suitable operating temperature of the semiconductor laser 2 is, for example, 20° C.

Figure 2:
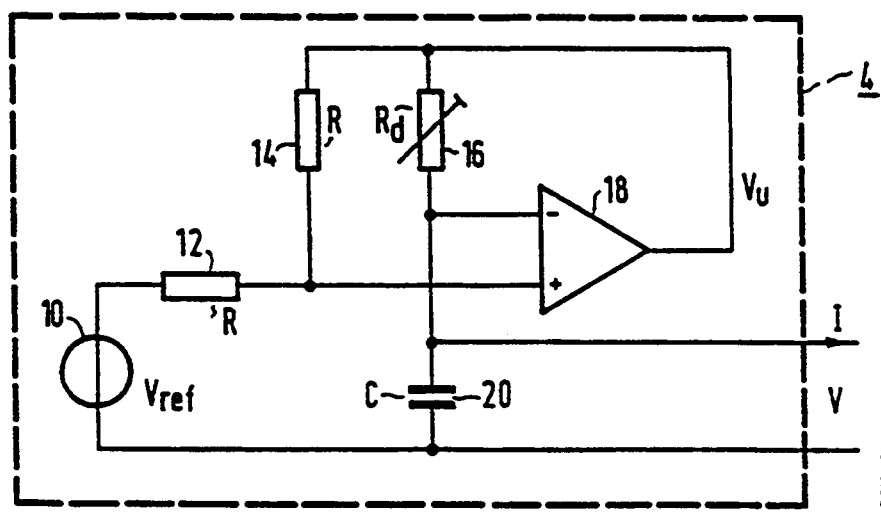
FIG. 2 shows a voltage source having a negative output impedance for use in the optical receiver as shown in FIG. 1.

In the voltage source 4 shown in FIG. 2, a first terminal of a reference voltage source 10, carrying a voltage value $V_{ref}$, is connected to a first terminal of a resistor 12 having a resistance R. A second terminal of the resistor 12 is connected to a first terminal of a resistor 14, also having a resistance R, and to a non-inverting input of a differential amplifier 18. A second terminal of the resistor 14 is connected to a first terminal of a resistor 16, having a value $R_d$, and to the output of the differential amplifier 18. A second terminal of the resistor 16 is connected to an inverting input of the differential amplifier 18 and to a first terminal of a capacitor 20. A second terminal of the reference voltage source 10 is connected to a second terminal of the capacitor 20. The voltage for the semiconductor laser 2 is now available between the first and second terminals of the capacitor 20.

The voltage source as shown in FIG. 2 is a voltage source having a negative output impedance according to the inventive idea. To derive the voltage V from the voltage $V_{ref}$ and current I (to be discussed hereinafter), the effect of the capacitor 20 is discarded. If the gain of the differential amplifier 18 is sufficiently large, the differential amplifier 18 may be assumed to cause the voltage difference between the inverting input and the non-inverting input to be zero.

Based on this assumption the voltage on both the inverting and the non-inverting input may be set equal to V. For an output voltage $V_u$ of the differential amplifier 18, the following comparisons may be written:

$$V_u = V + I \cdot R_d \qquad \text{Eq. (1)}$$

$$\frac{V_u - V}{R} = \frac{V - V_{ref}}{R} \qquad \text{Eq. (2)}$$

By using Eq. (1) in (2) and eliminating $V_u$, the following can be obtained $$V = V_{ref} + I.R_d \qquad \text{Eq. (3)}$$

From Eq. (3) it appears that a voltage source having a negative output impedance is obtained, as a result of which the output voltage increases with enhancing current I. If, according to the inventive idea, the value $R_d$ is made equal to the series resistance of the semiconductor laser, it is possible to obtain a DC voltage across the active layer of the semiconductor laser. It is conceivable that a slightly larger or smaller value of $R_d$ entails a better linearity of the optical amplifier, because the relation between the voltage across the active layer and the gain is based on simulation models.

The capacitor 20 is incorporated for rapidly supplying the necessary additional current for the semiconductor laser 2 in the case where the power of the optical input signal of the optical amplifier enhances rapidly. The differential amplifier is often incapable of supplying this additional current rapidly enough.

Figure 3:
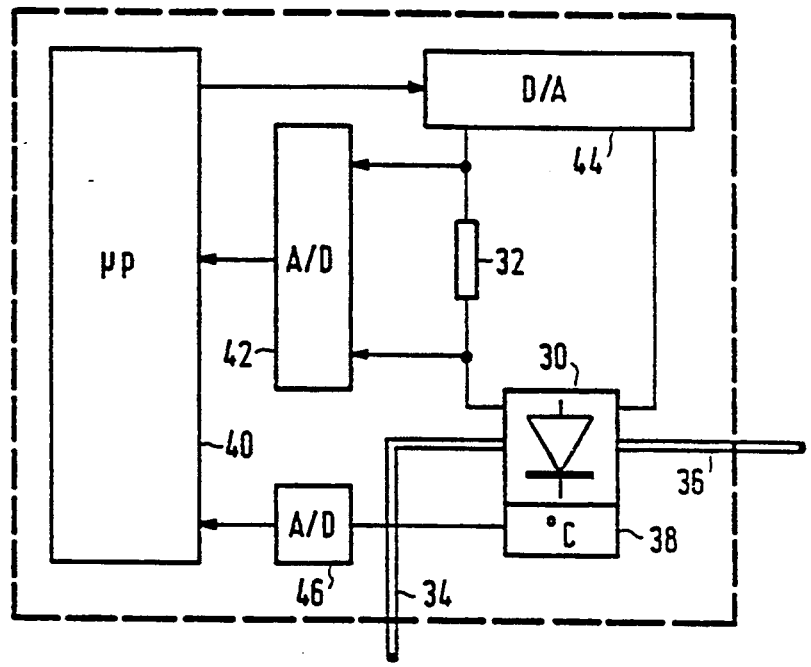
FIG. 3 shows a second embodiment of an optical amplifier according to the invention.

In the optical amplifier shown in FIG. 3 a first glass fiber 34 is coupled to a first facet of the solid-state laser, in this case a semiconductor laser 30. A second glass fiber 36 is coupled to a second facet of the semiconductor laser 30.

A temperature measuring unit, a temperature sensor 38 in this case, is connected to the semiconductor laser 30 to measure the temperature of the semiconductor laser 30. The output signal of the temperature sensor 38 is applied to an input of an analog-to-digital converter 46. The output of the analog-to-digital converter 46 is connected to a first input port of adjusting unit, in this case a microprocessor 40. An output port of the microprocessor 40 is coupled to an input of the voltage source, in this case a digital-to-analog converter 44.

The anode of the semiconductor laser 30 is connected to a first terminal of a resistor 32 and to a first input of an analog-to-digital converter 42. A second terminal of the resistor 32 is connected to a second input of the analog-to-digital converter 42 and to a first output of the digital-to-analog converter 44. A second output of the digital-to-analog converter 44 is connected to the cathode of the semiconductor laser 30. An output of the analog-to-digital converter 42 is coupled to a second input port of the microprocessor 40.

By measuring the temperature of the semiconductor laser 30, it is possible, according to the inventive idea to make the voltage produced by the voltage source dependent on the temperature of the semiconductor laser 30. This makes the gain of the optical amplifier independent of the temperature.

For this purpose, the microprocessor 40 stores the relation between the voltage necessary for the semiconductor laser 30 and the temperature at a constant gain. This relation may be stored in the microprocessor 40 by way of a Table or by way of a formula determined by curve fitting.

Establishing this relationship requires a single measurement of the necessary voltage as a function of temperature at a constant gain. It is conceivable to carry out calibration measurements periodically and to adjust the relation stored in the microprocessor 40 to compensate for the effect of ageing of the semiconductor laser 30.

To give the voltage source formed by the digital-to-analog converter 44 a negative output impedance, it is necessary to measure the current flowing through the semiconductor laser 30. This is performed by convening, with the aid of the analog-to-digital converter 42, the voltage across resistor 32 into a digital signal used for increasing the output voltage of the digital-to-analog converter 44 in the case where there is an enhancing current through the semiconductor laser 30.

If the response rate of the microprocessor 40 to variations in the required current is too low, the voltage source having negative resistance as shown in FIG. 2, may be used in instead of the resistor 32 in combination with the analog-to-digital converter 42. The voltage source 10 shown in FIG. 2 is then formed by the digital-to-analog converter 44.

Figure 4:
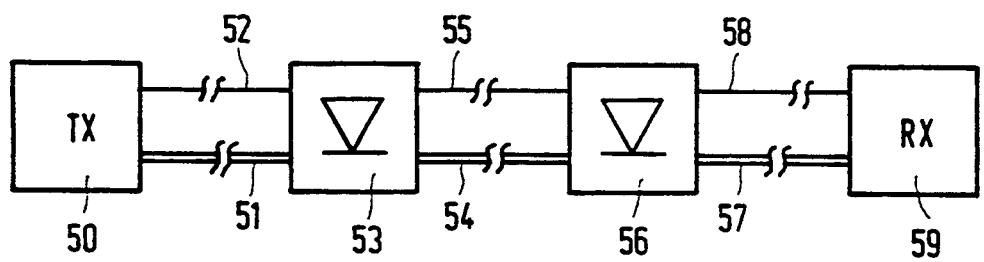
FIG. 4 shows a transmission system according to the invention.

In the transmission system as shown in FIG. 4 an optical transmitter 50 is coupled to an optical receiver 59 through glass fibers 51, 54 and 57. Between the glass fibers 51 and 54, an optical amplifier 53, according to the inventive idea, is inserted. Between the glass fibers 54 and 57, an optical amplifier 56 according to the inventive idea, is inserted. In addition, supply lines (i.e. connections) 52, 55 and 58 are inserted between the optical transmitter 50 and the optical receiver via the optical amplifiers 53 and 56.

The optical signal transmitted by the optical receiver 50 is transported through the glass fiber 51 to the optical amplifier 53 and amplified there. The amplified optical signal is transported through glass fiber 54 to the optical amplifier 56, amplified there, and then transmitted to the optical receiver 59. The electrical energy necessary for the optical amplifiers is conveyed to the respective optical amplifiers through the connections 52, 55 and 58.

I claim:

1. An optical amplifier, comprising:
    a solid-state laser for amplifying an optical input signal to produce an optical output signal; and
    a power supply source connected to said solid-state laser for supplying electrical pump energy thereto, said power supply source being a voltage source which generates a constant voltage.

2. The amplifier as claimed in claim 1, wherein the voltage source has a negative output impedance.

3. The optical amplifier as claimed in claim 2, wherein the absolute value of the output impedance is equal to series resistance of the solid-state laser.

4. The amplifier as claimed in claim 1, further comprising:
    a temperature measuring means for measuring the temperature of said solid-state laser; and
    adjusting means for adjusting the constant voltage generated by said voltage source in response to the temperature measured.

5. An optical transmission system, comprising an optical transmitter coupled to an optical receiver via at least one optical amplifier, said at least one optical amplifier having:
    a solid-state laser for amplifying an optical input signal to produce an optical output signal; and
    a power supply source which is connected to said solid-state laser for supplying electrical pump energy to said solid-state laser, said power supply source being a voltage source which generates a constant voltage.

6. The system as claimed in claim 5, wherein voltage source has a negative output impedance.

7. The system as claimed in claim 6, wherein the absolute value of the output impedance is equal to series resistance of said solid-state laser.

8. The system as claimed in claim 5, wherein said at least one amplifier further comprises:
   a temperature measuring means for measuring the temperature of said solid-state laser; and
   adjusting means for adjusting the constant voltage generated by said voltage source in response to the temperature measured.

9. The amplifier as claimed in claim 2, further comprising:
   temperature measuring means for measuring the temperature of said solid-state laser; and
   adjusting means for adjusting the constant voltage generated by said voltage source in response to the temperature measured.

10. The amplifier as claimed in claim 3, further comprising:
    temperature measuring means for measuring the temperature of said solid-state laser; and
    adjusting means for adjusting the constant voltage generated by said voltage source in response to the temperature measured.

11. The system as claimed in claim 6, wherein said amplifier further comprises:
    temperature measuring means for measuring the temperature of said solid-state laser; and
    adjusting means for adjusting the constant voltage generated by said voltage source in response to the temperature measured.

12. The system as claimed in claim 7, wherein said amplifier further comprises temperature measuring means for measuring the temperature of said solid-state laser, and adjusting means for adjusting the voltage generated by said voltage source in response to the temperature of the solid-state laser measured.

13. The amplifier as claimed in claim 1, wherein said solid-state laser has an active layer and said voltage source generates the constant voltage across the active layer.

14. The system as claimed in claim 5, wherein said solid-state laser has an active layer and said voltage source generates the constant voltage across the active layer.

* * * * *